United States Patent [19]
Shou et al.

[11] Patent Number: 5,811,859
[45] Date of Patent: Sep. 22, 1998

[54] MOS INVERTER FORMING METHOD

[75] Inventors: Guoliang Shou; Kazunori Motohashi; Makoto Yamamoto; Sunao Takatori, all of Tokyo, Japan

[73] Assignee: Yozan, Inc., Osaka, Japan

[21] Appl. No.: 743,161

[22] Filed: Nov. 4, 1996

Related U.S. Application Data

[62] Division of Ser. No. 536,327, Sep. 29, 1995.

[30] Foreign Application Priority Data

| Sep. 30, 1994 | [JP] | Japan | 6-261627 |
| Oct. 24, 1994 | [JP] | Japan | 6-284496 |
| Nov. 16, 1994 | [JP] | Japan | 6-306925 |
| Aug. 9, 1995 | [JP] | Japan | 7-224611 |

[51] Int. Cl.$^6$ .................................................. H01L 29/76
[52] U.S. Cl. ............................................ 257/369; 257/401
[58] Field of Search .................................. 257/369, 379, 257/401

[56] References Cited

U.S. PATENT DOCUMENTS

| 4,503,342 | 3/1985 | Adam | 307/475 |
| 4,961,012 | 10/1990 | Nishitani | 307/465 |
| 5,031,018 | 7/1991 | Shirato et al. | 257/401 |
| 5,132,563 | 7/1992 | Fujii et al. | 307/443 |
| 5,204,990 | 4/1993 | Blake et al. | 257/379 |
| 5,306,967 | 4/1994 | Dow | 307/482.1 |
| 5,420,806 | 5/1995 | Shou et al. | 364/606 |
| 5,631,863 | 5/1997 | Fechner et al. | 257/904 |

FOREIGN PATENT DOCUMENTS 6-215164  8/1994  Japan .

*Primary Examiner*—Mark V. Prenty
*Attorney, Agent, or Firm*—Cushman Darby & Cushman IP Group of Pillsbury Madison & Sutro, LLP

[57] ABSTRACT

MOS inverter forming method within a large scale integrated circuit (LSI) for providing a pair of circuits with the same performance each of which comprise a plurality of MOS inverters serially connected from the first stage to the last stage, each the MOS inverters being provided with an input, characterized in that, the input of the MOS inverters of the first stage are adjacently positioned with facing to each other.

3 Claims, 9 Drawing Sheets

MOS INVERTER FORMING METHOD

This is a division of application Ser. No. 08/536,327, filed Sep. 29, 1995.

FIELD OF THE INVENTION

The present invention relates to a MOS inverter forming method, especially to a MOS inverter forming method for forming a circuit of a plurality of MOS inverters with the same characteristics serially connected, for example, when a plurality of inverted amplifiers are formed in a large scale integrated circuit (LSI).

BACKGROUND OF THE INVENTION

The inventors of the present invention have proposed a circuit including an inverted amplifier of MOS inverter in Japanese Patent Application Hei 05-020676 and U.S. patent application Ser. No. 08/181,118. The circuit has a capacitive coupling for multiplying an analog voltage by a digital multiplier by each capacitance of the capacitive coupling. The capacitive coupling outputs an analog voltage to two stages sequential inverted amplifiers INV1 and INV2, or to inverted amplifiers INV3 and INV2 so that the output is stable and high in accuracy. Each inverted amplifier is composed of sequential MOS inverters of 3 stages an output of which is connected through a feedback capacitance to its input. The inverted amplifier keeps stability and linearity of the output by its large open gain as a multiplication of gains of three MOS inverters. However, MOS inverters have some dispersions in the offset voltages, which increase as the distance among MOS inverters extended within the LSI. The offset dispersion influences the output accuracy, especially the first stage inverter among three stages has great influences on the output.

SUMMARY OF THE INVENTION

The present invention is invented so as to solve the conventional problems and has a purpose to provide a method of forming MOS inverter for controlling the dispersion of offset voltage of MOS inverters to be minimum.

According to the present invention, the first stage MOS inverters of two inverted amplifiers are formed adjacent so as to face at their input sides to each other.

PREFERRED EMBODIMENT OF THE PRESENT INVENTION

Hereinafter, an embodiment of MOS inverter forming method according to the present invention is described with referring to the attached drawings.

Figure 1:
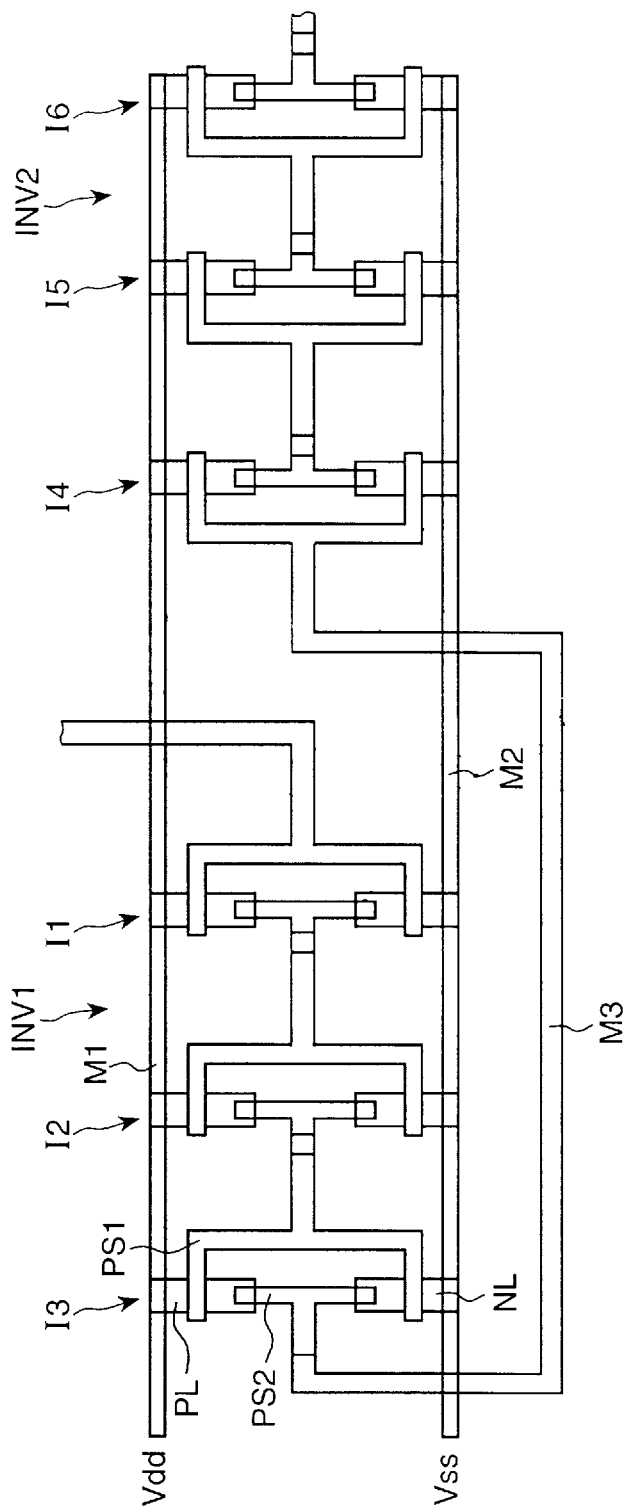
FIG. 1 is a plan view showing the first embodiment of MOS inverter forming method according to the present invention.
Figure 2:
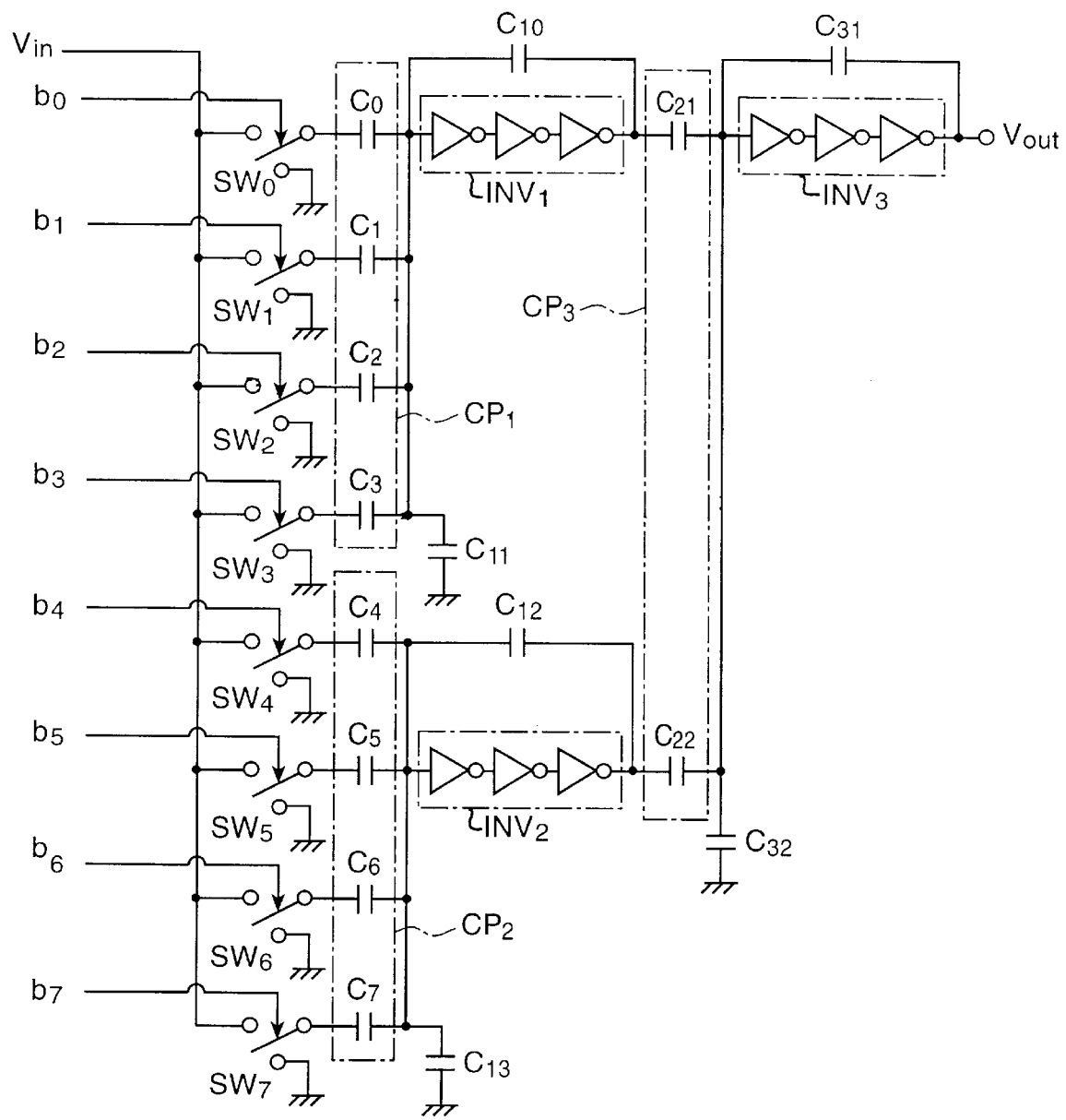
FIG. 2 is a circuit diagram showing the circuitry embodiment suitable for the present invention.

FIG. 1 shows a LSI pattern of two inverted amplifiers consisting of three MOS inverters serially connected. The first inverted amplifier INV1 consists of inverters I1, I2 and I3, and the second inverted amplifier INV2 consists of inverters I4, I5 and I6.

For each of inverters I1, I2, I3, I4, I5 and I6, there are shaped areas PL and NL made of p-layer and n-layer, respectively, an input and output lines PS1 and PS2 made of poly-silicon. The voltage Vdd and Vss of the power source and the ground are connected through metal lines M1 and M2 to the area PL and NL, respectively.

In FIG. 1, I1, I2 and I3 are arranged from the right to the left, and I4, I5 and I6 are arranged from the left to the right. The first stage inverter I1 and I4 are shaped at the adjacent positions to each other. This positioning make the offset voltage of the inverters I1 and I4 substantially equal, because adjacent inverters are similar in characteristics according to experiences.

In order to realize the adjacent positioning, an output of the inverter I3 is introduced through a metal line M3 to a position rightward from I1, and is connected to I4.

As mentioned above, dispersion of characteristic of the inverted amplifier is controlled to be minimum, and the accuracy is improved.

The present invention can be applied not only to the above inverted amplifier but to any circuits including a plurality of MOS inverters serially connecting with the same characteristics.

Hereinafter, the second embodiment of MOS inverter forming method according to the present invention is described with referring to the attached drawings.

Figure 3:
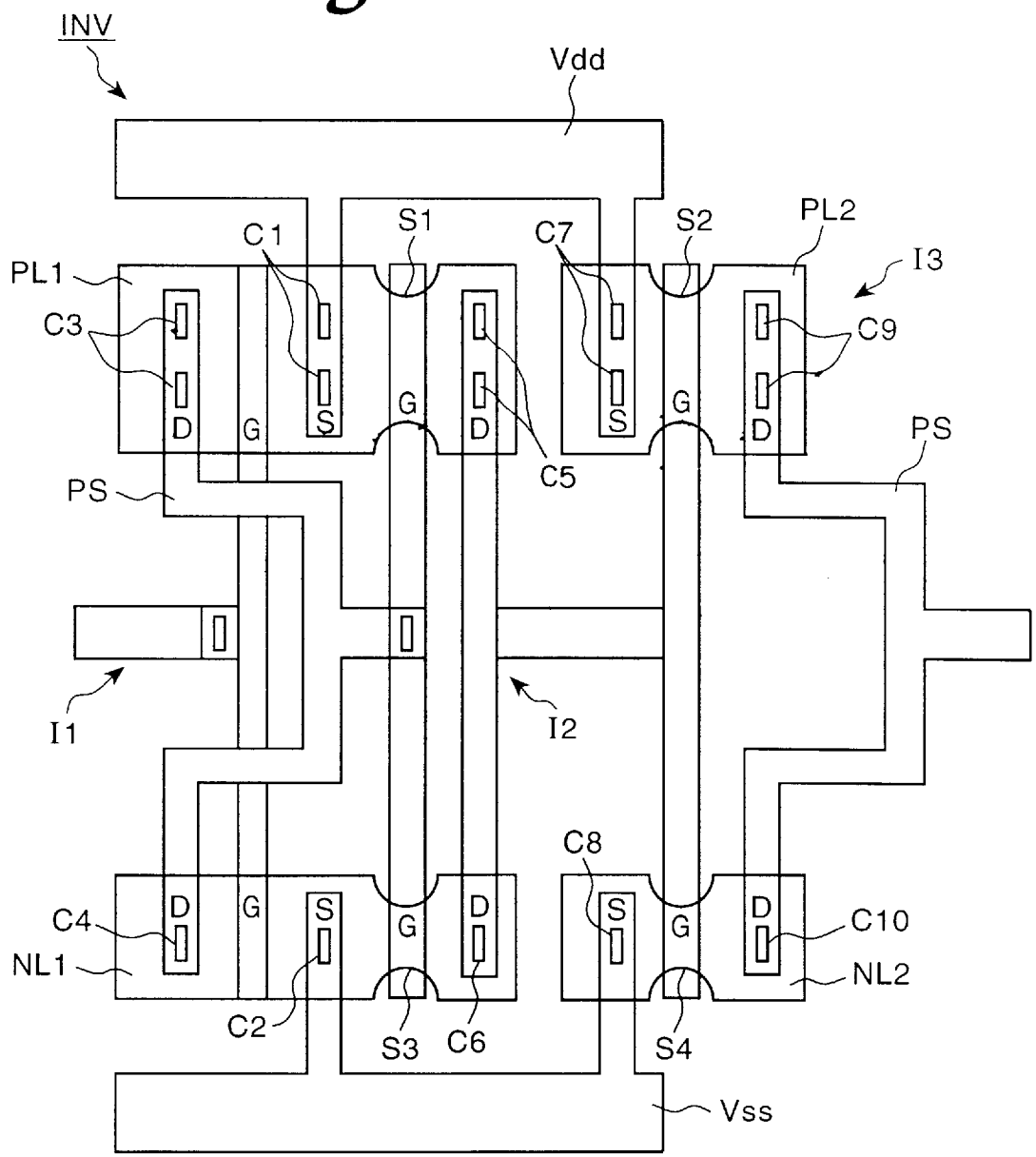
FIG. 3 is a plan view showing the second embodiment of MOS inverter circuit.

FIG. 3 shows LSI pattern of inverted amplifier INV consisting of 3 stages MOS inverters, I1, I2 and I3. For the inverters I1 and I2, there are shaped a common P-type semiconductor layer PL1 and a common N-type semiconductor layer NL1. P-type semiconductor layer PL2 and N-type semiconductor layer NL2 are shaped for I3. Drain voltage Vdd and source voltage Vss are connected to PL1 and NL1 through contacts C1 and C2. A contact is a metal part passing through in semiconductor layer in the direction of thickness, for electrical connection. The drain voltage Vdd and source voltage Vss are connected to PL2 and NL2 through contacts C7 and C8.

The semiconductor layers PL1 and NL1 are provided with contacts C3 and C4 for an output from the first stage, respectively, and are provided with contacts C5 and C6 for an output from the second stage, respectively. The semiconductor layers PL2 and NL2 are provided with contacts C9 and C10 for an output from the third stage, respectively, from which an output is introduced through a poly-silicon portion PS toward the next stage.

A strangulation portion S1 is provided between the contacts C1 and C5 in the semiconductor layer PL1, and a strangulation portion S3 is provided between the contacts C2 and C6 in the semiconductor layer NL1. A strangulation portion S2 is provided between contacts C7 and C9 in the semiconductor layers PL2, and a strangulation portion S4 is provided between contacts C8 and C10 in the semiconductor layer NL2.

These strangulation means S1 and S3 limit an electric current of the output of inverter I2, and it simultaneously decreases parasitic capacity of a transistor included in the inverter I2 by decreasing electric currency. A delay of performance of I2 due to the parasitic capacity is diminished, so the responsibility is highly improved. Usually, the strangulation portion causes an instability of output due to strangulated-channel-effect and increase of input side parasitic capacitance. However, these disadvantageous effect are not so influential in the second stage. The above advantageous effect is much more influential than the disadvantageous. On the other hand, the strangulation portions S2 and S4 limit an output electric currency of the inverter I3 of the final stage, and it is possible to save electrical power. Also in this stage, there is a possibility of disadvantageous effect above. The size of the strangulation portion should be decided so that the advantages are superior to the disadvantages.

The present invention is not limited to the circuit of three stage MOS inverters, but can be adopted to a circuit including serially connected MOS inverters for which one common semiconductor layer with the same polarity is shaped.

Hereinafter, the third embodiment of MOS inverter circuit according to the present invention is described with referring to the attached drawings.

Figure 4:
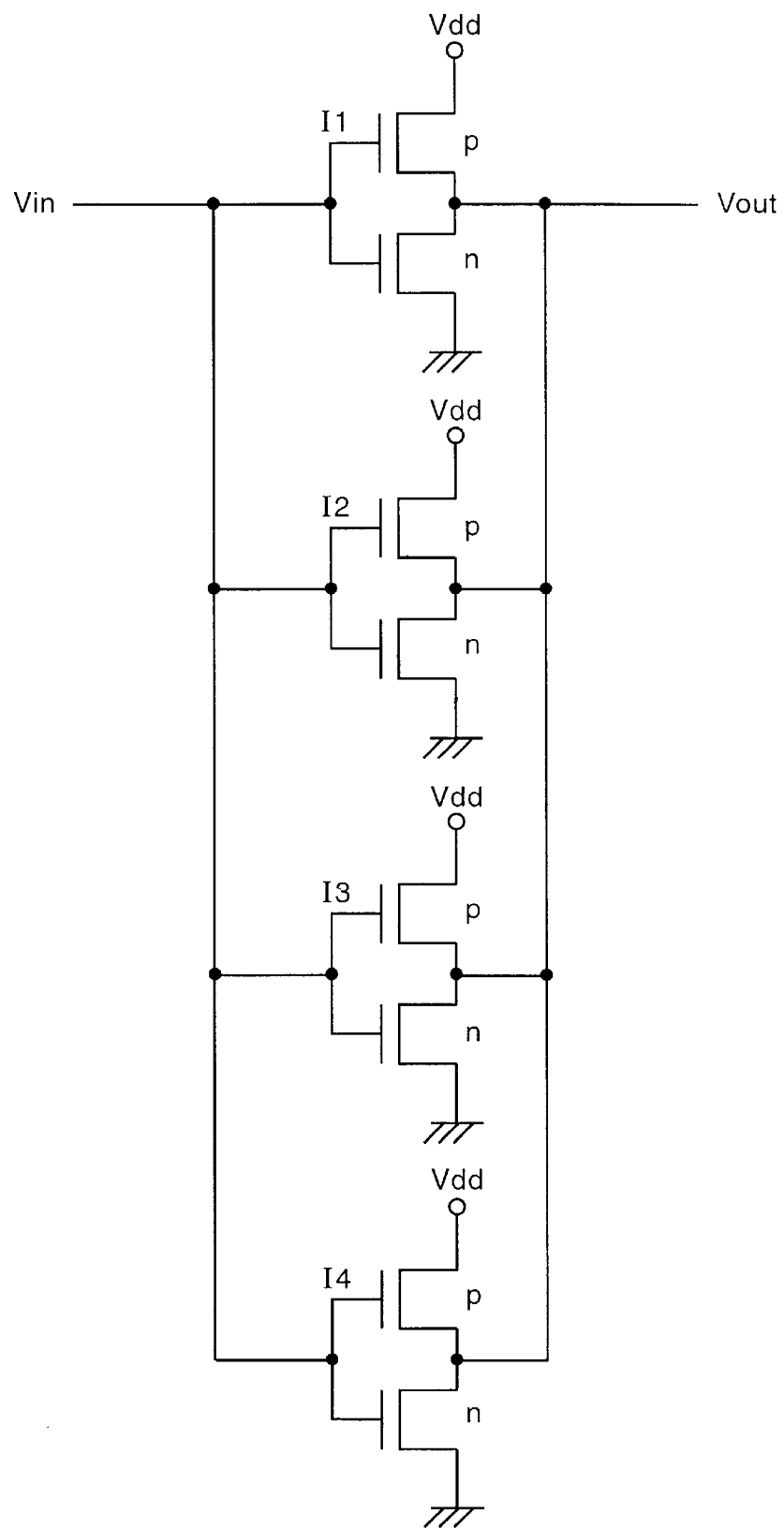
FIG. 4 is a circuit diagram showing MOS inverter forming method.

In FIG. 4, a MOS inverter circuit has a plurality of MOS inverters I1 to I4 parallelly connected at their inputs and outputs, to which a single output voltage Vout is generated I response to a single input voltage Vin. Each MOS inverter is a CMOS inverter composed of pMOS type FET and NMOS type FET. A source of pMOS type FET is connected to a voltage Vdd of the power source. This parallel circuit has characteristics of an average characteristics of the total inverters, and dispersion of each element is compensated. Therefore, there is no problem of low accuracy due to dispersion of elements, so it is easy to produce LSI of high accuracy. This causes improvement of yield and cost performance of manufacturing.

Here, when a threshold voltage of pMOS type FET is Vtp and threshold value of nMOS type FET is Vtn, then the threshold voltage Vin of a single inverter is given by the formula 1, Vin of N parallel inverters is given by the formula (2).

$$Vin = \frac{Vdd + Vtp + Vtn \cdot \sqrt{(\beta n/\beta p)}}{1 + \sqrt{(\beta n/\beta p)}} \qquad \text{Formula 1}$$

$$\sum_{i=1}^{N} \beta pi \cdot (Vin - Vdd - Vtpi)^2 = \sum_{i=1}^{N} \beta ni \cdot (Vin - Vtni)^2 \qquad \text{Formula 2}$$

βp and βn are coefficient shown by formulas 3 and 4. In the formulas, μp and μn are mobility of electron of pMOS type FET and NMOS type FET, ε and tox are dielectric constant and thickness of gate oxide layer per unit area, Wp and Wn are channel width, and Lp and Ln are channel length.

$$\beta p = \frac{\mu p \cdot \epsilon}{tox} \cdot \frac{Wp}{Lp} \qquad \text{Formula 3}$$

$$\beta n = \frac{\mu n \cdot \epsilon}{tox} \cdot \frac{Wn}{Ln} \qquad \text{Formula 4}$$

Dispersion of threshold value appears as a normal distribution in response to a value of β, however, formula 2 can not be analytically solved because it involves β of two terms.

It is well known that a bi-polar transistor is improved in the quality by parallel connecting. Therefore, electrical elements parallelly connected have stable characteristics due to averaged characteristics of each element because the characteristics of the elements are statistically averaged.

This expectation is proved by an experiment. According to a simulation experiment, dispersion V1(Vin) of threshold voltage Vin shown by formula 1 is larger than a dispersion V2(Vin) of threshold voltage Vin shown by formula 2.

Figure 5:
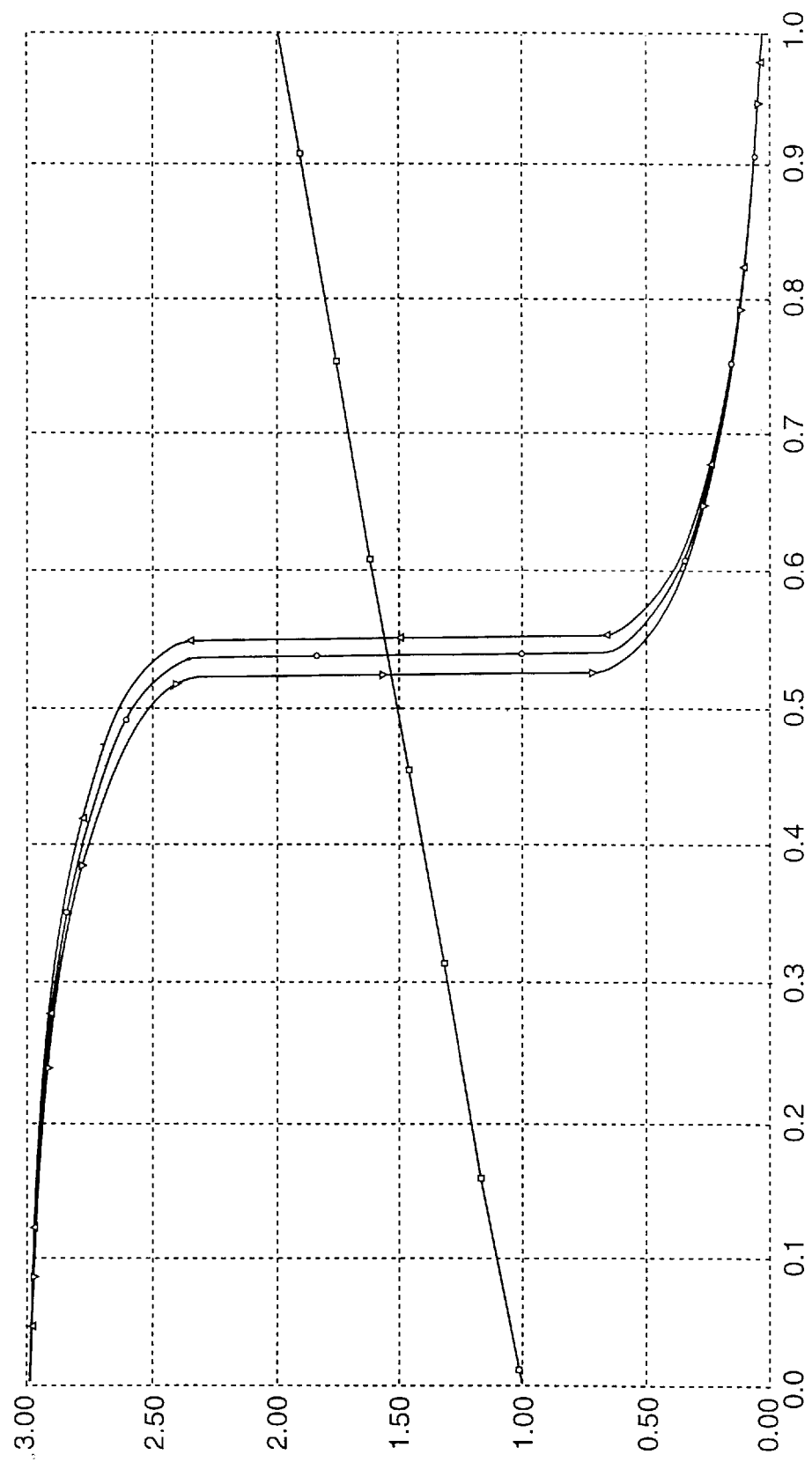
FIG. 5 is a graph showing a characteristics of a plurality of MOS inverters parallelly connected.

FIG. 5 is a graph showing voltage characteristic in a case that 2 inverters are parallelly connected. □—□ shows a voltage Vin impressed to an input terminal, ▽—▽ and ▽—▽ show characteristics of a single inverter and ○—○ shows characteristics of two inverters parallelly connected.

It will be understood from FIG. 5 that an average characteristics of characteristics of total inverters is obtained. It also valid when the number of inverters are over three. By parallelly connecting a plurality of inverters, the accuracy of threshold value can statistically be improved than a single inverter.

Figure 6:
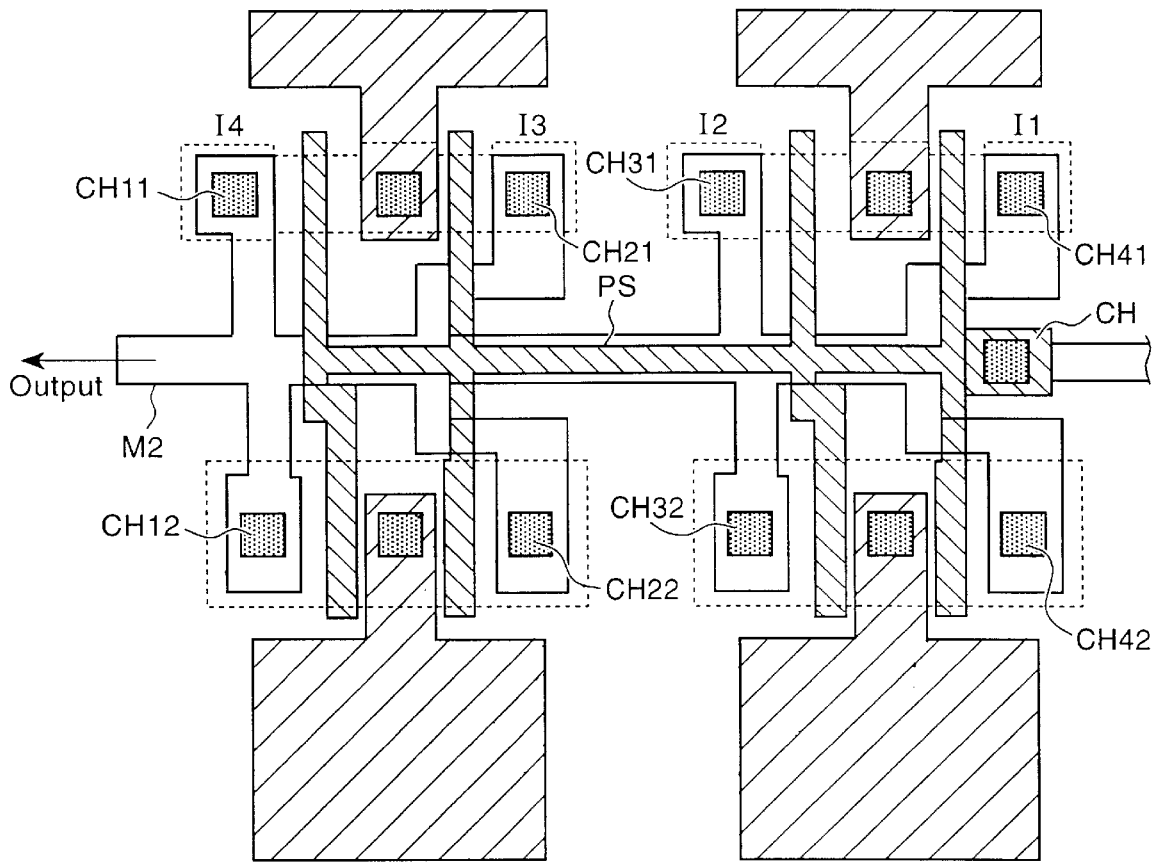
FIG. 6 is a plan view showing the third embodiment of LSI pattern.

FIG. 6 shows a pattern in LSI of MOS inverter circuit. Usually, input and output of each MOS inverter are wired in a different layer, called input/output layer, from a layer, called semiconductor layer, where P-layer and N-layer of MOS are formed. The input and output are introduced through contact holes to the semiconductor layer. In a pattern of FIG. 6, only one contact hole CH is commonly provided on the input side for four MOS inverters I1 to I4. Input voltage is led to a gate of each MOS inverter from the contact hole CH through a poly-silicon PS.

On the output side of each of MOS inverters I1, I2, I3 and I4, there are provided two contact holes CH11 and CH12, CH21 and CH22, CH31 and CH32, CH41 and CH42, respectively. The outputs of pMOS and nMOS are led to the input/output layers from these contact holes. Outputs of each MOS inverter are connected to the circuit of the next stage through metallic wire M2.

Generally, the contact hole is formed in square a side of which is longer than a width of the metallic wire. In a case plurality of contact holes are provided, it is necessary to provide intervals between contact holes of a width wider than a predetermined width. Then, wiring area is increased by such a restrictions when a contact hole is to be formed. The embodiment above is advantageous because a lot of contact holes are neglected by a common contact hole for input. As a result, wiring is simplified and wiring area is decreased.

Hereinafter, the fourth embodiment of an inverter circuit according to the present invention is described with referring to the attached drawings.

Figure 7:
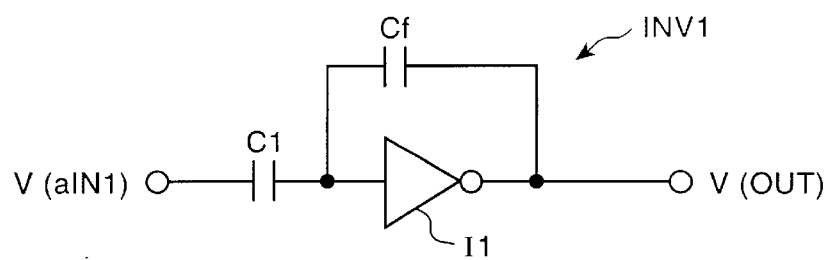
FIG. 7 is a circuit diagram showing the fourth embodiment.

FIG. 7 shows an inverter circuit INV1 for obtaining inverted output V(OUT) with weight in response to an input voltage V(aIN1). The inverted circuit has one stage of MOS inverter I1, and its input is connected to V(aIN1) through input capacitance C1, and its output is connected to its input through a feedback capacitance Cf.

Logical inverted output V' of V(aIN1) is defined in formula 5 when power voltage is Vdd.

$$V'=Vdd-(C1/Cf)V(aIN1) \qquad \text{Formula 5}$$

Figure 8:
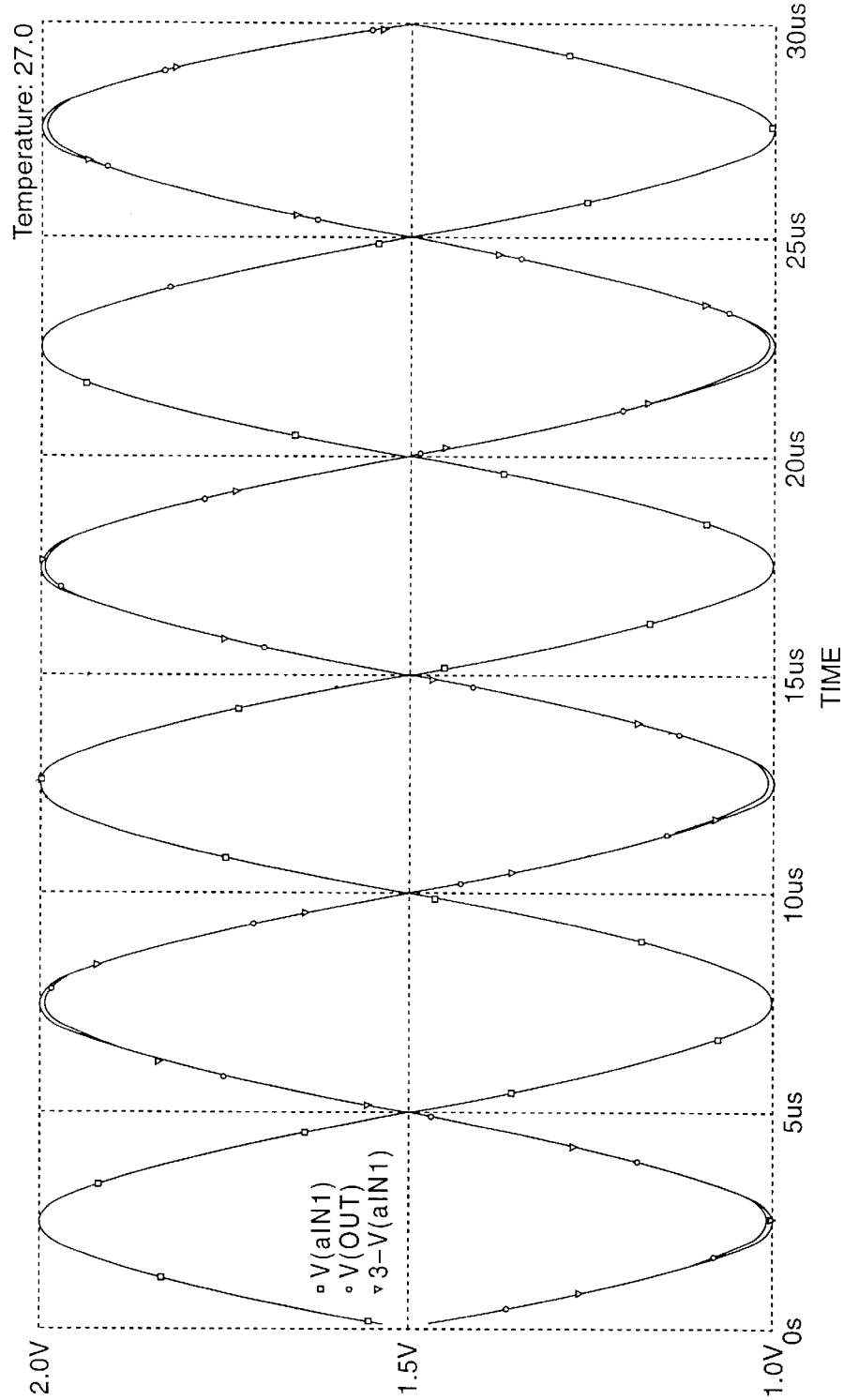
FIG. 8 is a graph showing a simulation result of the fourth embodiment.

FIG. 8 is a simulation result of V' and V(OUT) for their comparison by an analog circuit simulator Hspice.

In FIG. 8, V(aIN1), V(OUT) and V' are shown by "□", "○" and "▽", respectively. As shown in FIG. 8, when Vdd is equal to 3[V], the following formula 6 is defined.

$$1[V] \leq (aIN1) \leq 2[V] \qquad \text{Formula 6}$$

V(aIN1) is equal to or more than 1[V] and equal to or less than 2[V], then V(OUT) is good approximation of V'.

By an inversion with weight by MOS inverter of one stage, rather high accuracy can be obtained in an appropriate condition. Phase difference between input and output and consumed electricity is decreased because MOS inverter has only one stage.

Figure 9:
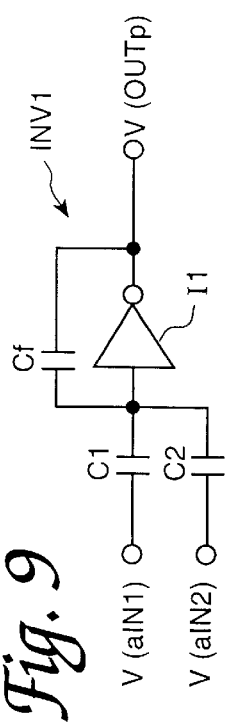
FIG. 9 is a circuit diagram showing the fifth embodiment.

Hereinafter, the fifth embodiment of the present invention is descried with referring to the attached drawings. FIG. 9 shows an inverter circuit INV1 for summation with weighting. This circuit includes input capacitances C1 and C2 parallelly connected to an input of a MOS inverter I1 of one stage. This embodiment is an embodiment similar to the fourth embodiment, but with the additional capacitance C2 parallel to the capacitance C1. An inverted summation is generated of weighted input voltages inputted to the first and the second capacitances. An output of the MOS inverter I1 is connected through a feedback capacitance Cf to its input.

Input voltage (aIN1) and V(aIN2) are connected to input capacitances C1 and C2, and V(OUTp) is generated as an output voltage. A mathematically ideal value V' of inversion of weighted summation is defined in formula 7.

$$V'=Vdd-\{C1V(aIN1)+C2V(a1N2)\}/Cf \qquad \text{Formula 7}$$

Figure 10:
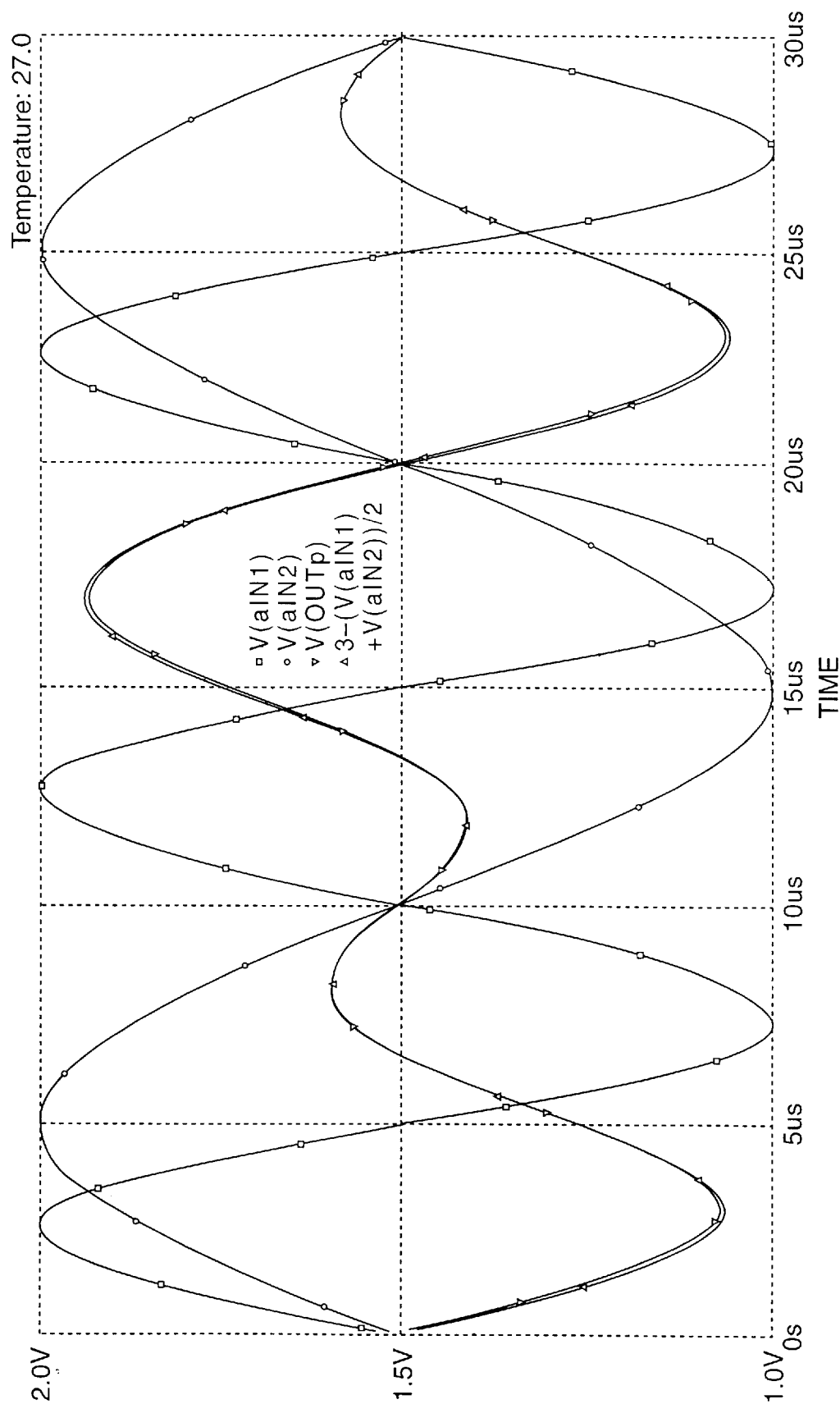
FIG. 10 is a graph showing a simulation result of the fifth embodiment.

FIG. 10 shows a practical output V(OUTp) simulated by Hspice, comparing with V'. In FIG. 10, V(aIN1), V(aIN2), V(OUTp) and V' are shown by "□", "◇", "∇", and "Δ", respectively. As will be understood from FIG. 10, when Vdd is equal to 3[V], V(OUT) is a good approximation of V(OUT) in the range of the following formulas 8 and 9.

$$1[V] \leq V[aIN1] \leq 2[V] \qquad \text{Formula 8}$$

$$1[V] \leq V[aIN2] \leq 2[V] \qquad \text{Formula 9}$$

As mentioned above, sufficiently high accuracy can be obtained by one stage MOS inverter.

Figure 11:
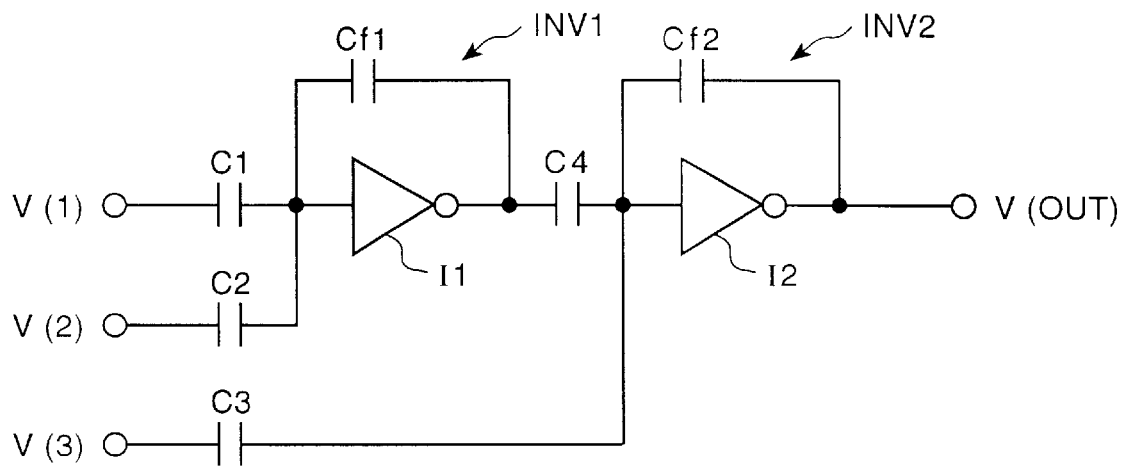
FIG. 11 is a circuit diagram showing the sixth embodiment.

FIG. 11 is a circuit of the sixth embodiment. An inverter circuit INV1 has MOS inverts I1 and I2 serially connected, each of which is one stage MOS inverter. Parallel input capacitances C1 and C2 are connected to an input of inverter I1. An output of the inverter I1 is connected to its input through a feedback a capacitance Cf1, and the output is connected to an input of the inverter I2 through connecting capacitance C4. An input capacitance C3 is further connected to the input of I2, parallelly to the capacitance C4. An output of inverter I2 is connected to the input through feedback capacitance Cf2. Input voltages V(1), V(2) and V(3) are connected to capacitances C1, C2 and C3.

Inverter circuit INV1 consists of one stage MOS inverter I1, capacitances C1, C2 and Cf1, and inverter circuit INV2 consists of one stage MOS inverter I2, capacitances C4 and C3. The inverter circuit INV1 generates inverted output of summation of weighted voltages of V(1) and V(2), on the other hand, inverter circuit INV2 generates inverted output V(OUT) of weighted summation of an output from INV1 and the input V(3).

A mathematical output of inverted summation with weighting is shown by formula 10, as V'.

$$V' = \frac{C_1 C_4}{Cf_1 Cf_2} V(1) + \frac{C_2 C_4}{Cf_1 Cf_2} V(2) - \frac{C_3}{Cf_2} V(3) - \frac{C_1 C_4 + C_2 C_4 - C_1 C_3}{Cf_1 Cf_2} Vb \qquad \text{Formula 10}$$

V(OUT) is a good approximation. A simulation result neglected.

Figure 12:
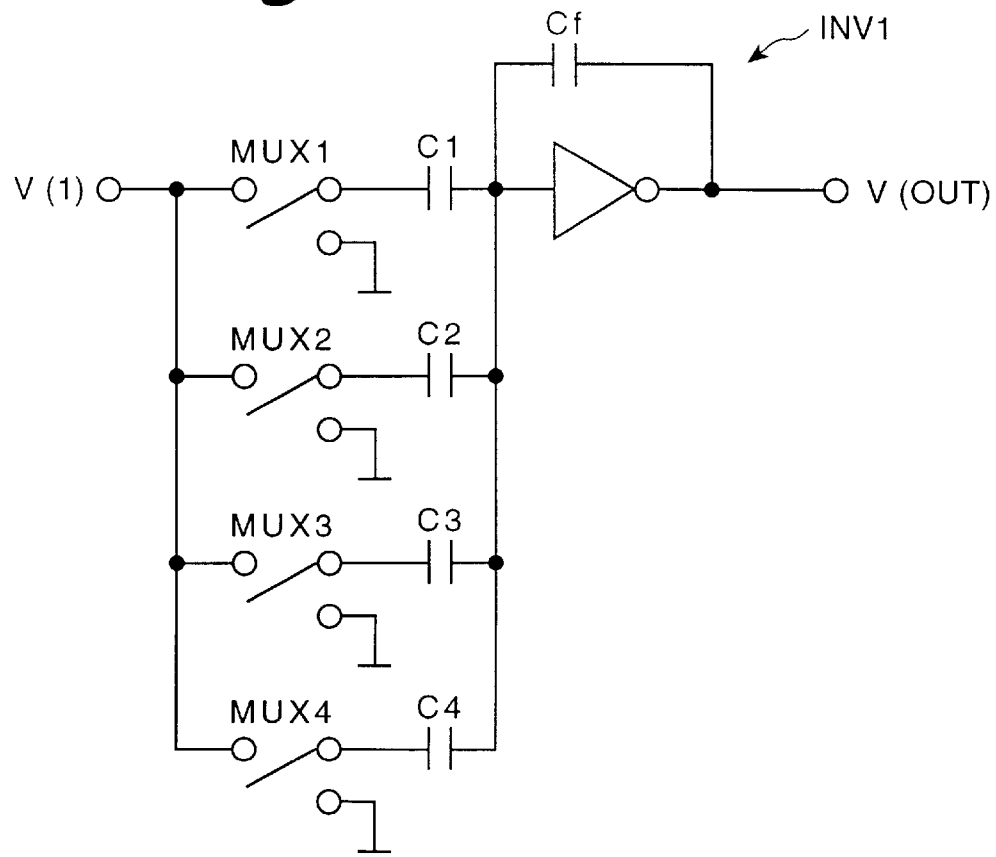
FIG. 12 is a circuit diagram showing the seventh embodiment.

FIG. 12 is a circuit diagram showing the eighth embodiment. A plurality of input capacitances C1 to C4 are parallelly connected to a MOS inverter I1 of one stage.

These capacitances are commonly connected to an input voltage V(1) through a multiplexers MUX1, MUX2, MUX3 and MUX4, respectively. The multiplexers connects the input voltage V(1) or the ground to the capacitances. An output of the inverter I1 is connected to its input through feedback capacitance Cf.

By switching the multi-plexers MUX1, MUX2, MUX3 and MUX4, a weight for V(1) is controlled so that an effect of multiplication is obtained. The multiplication result is generated as an output V(OUT) from INV1. Capacity ratio of C1, C2, C3 and C4 and Cf is defined as in formula 11.

$$C1:C2:C3:C4:Cf=1:2:4:8:16 \qquad \text{Formula 11}$$

When switching positions of MUX1, MUX2, MUX3 and MUX4 are represented by b0, b1, b2 and b3, which correspond to 0/1 (0:ground side, V:V(1) side), A mathematically ideal output V' of the circuit is shown in formula 12.

$$V'=(b0C1+b1C2+b2C3+b3C4)V(1)/Cf \qquad \text{Formula 12}$$

This is a normalized multiplication result of V(1) multiplied by a binary number consisting of bits b0 to b3. Simulation result is omitted, but V(OUT) is a good approximation of V'.

What is claimed is:

1. A method for forming a MOS inverter arrangement within a large scale integrated circuit (LSI) comprising:

providing a pair of circuits with the same performance characteristics, each circuit including a plurality of MOS inverters with common semiconductor layers elongated across said MOS inverters, wherein at least one of said common semiconductor layers is provided with a strangulation portion between adjacent MOS inverters so that said semiconductor layer is locally narrow in width between said adjacent MOS inverters, whereby the strangulation portion controls electric current flow between said adjacent MOS inverters so as to decrease parasitic capacitance.

2. MOS inverter forming method as claimed in claim 1, wherein said circuit is an inverted amplifier an output of which is connected through a feedback capacitance to its input.

3. A method for forming a MOS inverter arrangement within a large scale integrated circuit (LSI) comprising:

providing a plurality of MOS inverters arranged in parallel with the same performance characteristics, each said MOS inverter have a semiconductor layer and an input/output layer, wherein an input signal in said input/output layer is introduced from said input/output layer through one contact hole to said semiconductor layer and is coupled to gates of all of said MOS inverters, and wherein outputs of said MOS inverters are introduced from said semiconductor layer through independent contact holes from one another to said input/output layer and are coupled to an output line.

* * * * *

UNITED STATES PATENT AND TRADEMARK OFFICE
CERTIFICATE OF CORRECTION

PATENT NO. : 5,811,859
DATED : Sep. 22, 1998
INVENTOR(S) : Shou et al.

It is certified that error appears in the above-identified patent and that said Letters Patent is hereby corrected as shown below:

ON THE FACE OF THE PATENT
The face of patent presently reads:

[73] Assignee: Yozan Inc., Tokyo, Japan

The face of the patent should read:

--[73] Assignee: Yozan Inc., Tokyo, Japan;

Sharp Kabushiki Kaisha, Osaka, Japan--

Signed and Sealed this

Thirty-first Day of August, 1999

Attest:

Q. TODD DICKINSON

*Attesting Officer*   *Acting Commissioner of Patents and Trademarks*